(12) United States Patent
Adachi

(10) Patent No.: US 10,453,981 B2
(45) Date of Patent: Oct. 22, 2019

(54) SOLAR CELL, SOLAR CELL MODULE, METHOD FOR MANUFACTURING SOLAR CELL, AND METHOD FOR MANUFACTURING SOLAR CELL MODULE

(71) Applicant: Kaneka Corporation, Osaka (JP)

(72) Inventor: Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/479,692

(22) Filed: Apr. 5, 2017

(65) Prior Publication Data
US 2017/0207356 A1    Jul. 20, 2017

Related U.S. Application Data

(63) Continuation of application No. PCT/JP2015/078328, filed on Oct. 6, 2015.

(30) Foreign Application Priority Data

Oct. 6, 2014    (JP) .................................. 2014-205885

(51) Int. Cl.
*H01L 31/18*    (2006.01)
*H01L 31/0465*    (2014.01)
(Continued)

(52) U.S. Cl.
CPC ........ *H01L 31/0465* (2014.12); *H01L 31/028* (2013.01); *H01L 31/02013* (2013.01);
(Continued)

(58) Field of Classification Search
CPC ............... H01L 31/0465; H01L 31/048; H01L 31/02013; H01L 31/022425;
(Continued)

(56) References Cited

U.S. PATENT DOCUMENTS 4,610,077 A * 9/1986 Minahan ......... H01L 31/022425
136/256
5,514,504 A * 5/1996 Iijima .................... G02F 1/135
349/89
(Continued)

FOREIGN PATENT DOCUMENTS

JP    H09129904 A    5/1997
JP    2001-044461 A    2/2001
(Continued)

OTHER PUBLICATIONS

International Search Report issued in International Application No. PCT/JP2015/078328; dated Dec. 8, 2015 (2 pages).
(Continued)

*Primary Examiner* — Golam Mowla
(74) *Attorney, Agent, or Firm* — Osha Liang LLP

(57)    ABSTRACT

A solar cell includes a photoelectric conversion section that, includes an n-type crystal silicon substrate, a p-type silicon-based thin-film provided on a first principal surface, and an n-type silicon-based thin-film provided on a second principal surface, and further includes a first electrode layer on the p-type silicon-based thin-film, and a second electrode layer on the n-type silicon-based thin film. A patterned collector electrode is provided on the first electrode layer. On the first principal surface of the photoelectric conversion section, a wraparound portion of the second electrode layer, an insulating region where neither the first electrode layer nor the second electrode layer is provided, and a first electrode layer-formed region are arranged in this order from a peripheral end.

6 Claims, 4 Drawing Sheets

(51) Int. Cl.
*H01L 31/02* (2006.01)
*H01L 31/0224* (2006.01)
*H01L 31/0236* (2006.01)
*H01L 31/028* (2006.01)
*H01L 31/048* (2014.01)

(52) U.S. Cl.
CPC .. *H01L 31/0236* (2013.01); *H01L 31/022425* (2013.01); *H01L 31/022491* (2013.01); *H01L 31/048* (2013.01); *H01L 31/1804* (2013.01); *H01L 31/1884* (2013.01)

(58) Field of Classification Search
CPC ......... H01L 31/022491; H01L 31/0236; H01L 31/028; H01L 31/1804; H01L 31/1884
See application file for complete search history.

(56) References Cited

U.S. PATENT DOCUMENTS

| | | | |
|---|---|---|---|
| 5,935,344 A | 8/1999 | Endo et al. | |
| 2005/0126625 A1* | 6/2005 | Yamamoto | H01L 31/022425 136/256 |
| 2006/0219292 A1 | 10/2006 | Asaumi et al. | |
| 2011/0120521 A1 | 5/2011 | Yamaguchi et al. | |
| 2015/0075601 A1 | 3/2015 | Adachi et al. | |

FOREIGN PATENT DOCUMENTS

| | | |
|---|---|---|
| JP | 2006310774 A | 11/2006 |
| JP | 2010123737 A | 6/2010 |
| JP | 2014060264 A | 4/2014 |
| TW | 201123473 A | 7/2011 |
| TW | 201349530 A | 12/2013 |
| WO | 2012059878 A1 | 5/2012 |

OTHER PUBLICATIONS

International Preliminary Report on Patentability issued in International Application No. PCT/JP2015/078328 dated Apr. 20, 2017 (11 pages).

Office Action issued in corresponding Taiwanese Patent Application No. 104132884; dated May 14, 2019 (14 pages).

* cited by examiner

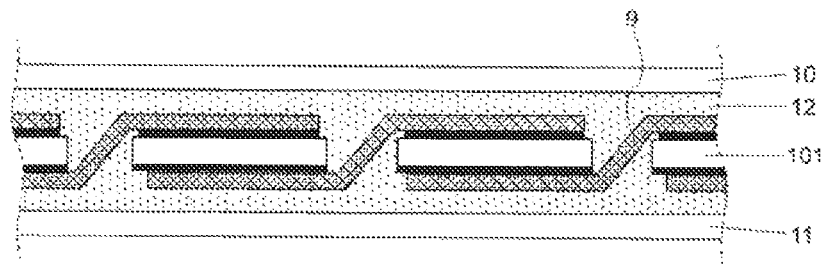
FIG. 3
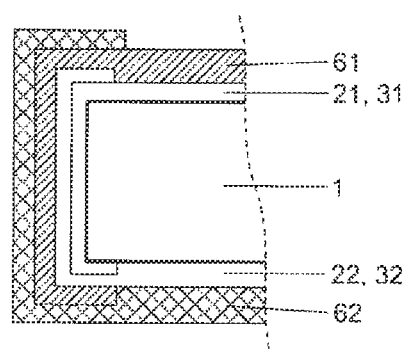
PRIOR ART
FIG. 4
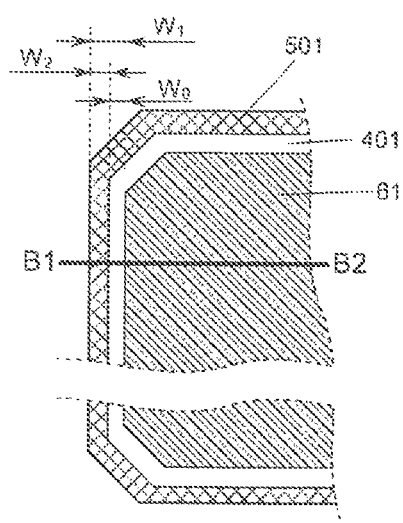 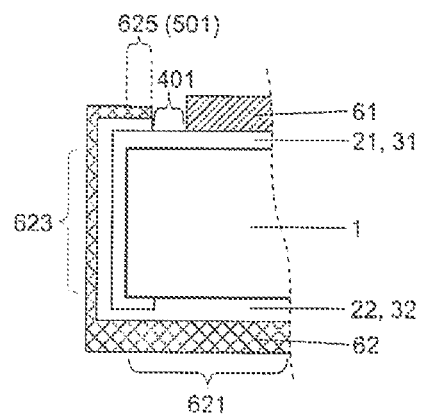
FIG. 5A  FIG. 5B

SOLAR CELL, SOLAR CELL MODULE, METHOD FOR MANUFACTURING SOLAR CELL, AND METHOD FOR MANUFACTURING SOLAR CELL MODULE

TECHNICAL FIELD

One or more embodiments of the present invention relates to solar cell and solar cell module and method for manufacturing solar cell and solar cell module.

BACKGROUND

In a solar cell, an electrode is provided on a photoelectric conversion section for efficiently extracting carriers, which are generated in the photoelectric conversion section having a semiconductor junction, to an external circuit. In a heterojunction solar cell including on a crystalline silicon substrate a semiconductor layer composed of a silicon-based thin-film, a transparent electrode layer and a metal collecting electrode are provided as electrodes, and a patterned collecting electrode is provided on the light incident side. The electrode in the solar cell is connected to a wiring member, and the wiring member is electrically connected to the adjacent solar cell or the external circuit to perform modularization.

In formation of a photoelectric conversion section of a heterojunction solar cell, thin-films such as a semiconductor layer, a transparent electrode layer and a metal electrode are generally formed on the silicon substrate surface by a dry process such as a plasma-enhanced CVD method, a sputtering method or the like. These thin-films exist not only on the front surface of a substrate, but also on the side surface and on the back surface since the deposited films wrap around thereon, and thereby cause a short circuit and leakage current between the front surface and the back surface.

Patent Document 1 suggests a method in which a semiconductor layer and an electrode layer are formed while a peripheral portion of a crystalline silicon substrate is covered with a mask for preventing an electrical short-circuit and leakage resulting from wraparound of a thin-film. Patent Document 2 suggests a method in which after formation of a semiconductor layer and an electrode layer, a peripheral portion of a crystalline silicon substrate is cleaved and removed to form a side surface of a photoelectric conversion section into a cut surface to which the silicon substrate is exposed. Patent Document 3 suggests a method in which a cell peripheral portion is irradiated with laser light to form a separation groove, and a transparent electrode layer and a semiconductor layer on a crystalline silicon substrate are removed. For the cut surface in Patent Document 2 and the separation groove in Patent Document 3, an electrode and a semiconductor layer do not exist on the surface, and thus a silicon substrate is exposed, so that a short-circuit part resulting from wraparound is removed.

PRIOR ART DOCUMENT

Patent Documents

Patent Document 1: Japanese Patent Laid-open Publication. No. 2001-44461
Patent Document 2: Japanese Patent Laid-open Publication No. 2006-310774
Patent Document 3: Japanese Patent Laid-open Publication No. 9-129904

In a method in which a semiconductor layer and an electrode layer are formed while a peripheral portion on both sides of a substrate is covered with a mask as in Patent Document 1, it is necessary to position the mask in formation of the layers, resulting in deterioration of productivity. Carriers on the peripheral portion of the substrate cannot be collected at the electrode layer, and therefore a power generation loss (a reduction in fill factor (PP) and current amount) occurs due to a reduction in carrier collection efficiency.

When the peripheral portion of the substrate is cleaved and removed as in Patent Document 2, the area of the silicon substrate decreases, and therefore the current amount tends to decrease. When a separation groove is formed as in Patent Document 3, the outer periphery of the separation groove cannot be used as an effective power generation area, and therefore the current amount tends to decrease as in the case of Patent Document 2.

When a short-circuit between electrodes on both sides of a substrate, and leakage are to be prevented by a method such as deposition using a mask, formation of a separation groove or cleavage as described above, the effective power generation area decreases, and the manufacturing process is complicated. The inventors have conducted studies, and resultantly found that when there exists a region in which a silicon substrate and a semiconductor layer are exposed to the peripheral portion of a photoelectric conversion section of a solar cell, a wiring member comes into contact with the silicon substrate and the semiconductor layer exposed to the peripheral portion at the time of connecting the solar cell to the wiring member to perform modularization, so that a leakage current and mechanical damage tend to occur, leading to deterioration of module performance.

SUMMARY

One or more embodiments of the present invention provide a solar cell in which a short-circuit between electrodes on both sides is prevented, and deterioration of characteristics due to contact with a wiring member hardly occurs in modularization.

A solar cell according to one or more embodiments of the present invention includes a photoelectric conversion section that including an n-type crystalline silicon substrate, a p-type silicon-based thin-film provided on a first principal surface of the silicon substrate, and an n-type silicon-based thin-film provided on a second principal surface of the silicon substrate. A transparent first electrode layer is provided on the p-type silicon-based thin-film, and a second electrode layer is provided on the n-type silicon-based thin-film. A patterned collecting electrode is provided on the first electrode layer.

In one or more embodiments, the p-type silicon-based thin-film is also provided on the side surface and the peripheral portion of the second principal surface of the silicon substrate, and the n-type silicon-based thin-film is also provided on the side surface and the peripheral portion of the first principal surface of the silicon substrate. On the side surface of the photoelectric conversion section, the p-type silicon-based thin-film is situated closer to the silicon substrate than the n-type silicon-based thin-film. In one or more embodiments, formation of the p-type silicon-based thin-film and formation of the n-type silicon-based thin-film are each performed by a dry process without using a mask.

In one or more embodiments, when the first electrode layer is deposited by a dry process while the peripheral portion of the first principal surface of the photoelectric conversion section is covered with a mask, the peripheral portion of the first principal surface has a region in which the first electrode layer is not formed. When the second electrode layer is deposited on the second principal surface of the photoelectric conversion section without using a mask, the second electrode layer is formed to extend from the second principal surface through the side surface to the peripheral portion of the first principal surface in a wraparound manner. In one or more embodiments, the wraparound portion the second electrode layer on the first principal surface has a thickness of 1 to 200 nm. The thickness of the wraparound portion may be smaller than the thickness of the first electrode layer and the thickness of the second electrode layer on the second principal surface.

In one or more embodiments, on the first principal surface of the photoelectric conversion section, a wraparound portion of the second electrode layer, insulating region on which neither the first electrode layer nor the second electrode layer is provided, and a first electrode layer-formed region are arranged in this order from the peripheral end.

In one or more embodiments, the photoelectric conversion section has, on the first principal surface, an irregularity structure having sloped surfaces. Specific examples of the irregularity structure having sloped surfaces include pyramid-shaped irregularity structure.

In one or more embodiments, a wiring member for electrically connecting the solar cell to an external circuit or other solar cell is connected to the patterned collecting electrode of the solar cell, and the solar cell after the wiring member is connected is encapsulated to prepare a solar cell module. In one embodiment, the wiring member has an irregularity structure on a surface on the light incident side.

A solar cell according to one or more embodiments of the present invention has an insulating region on a first principal surface of a photoelectric conversion section, so that deterioration of the conversion characteristic due to a short-circuit between electrodes and leakage is suppressed. The peripheral end of the first principal surface is protected by a second electrode layer formed to extend from a second principal surface in a wraparound manner, and therefore damage due to contact with a wiring member in modularization can be prevented. Further, the thickness of the wraparound portion of the second electrode layer is small, and the leakage current through the wiring member is small. Therefore, the solar cell has excellent module performance.

BRIEF DESCRIPTION OF THE DRAWINGS

FIG. 3 is a schematic sectional view showing a solar cell module according to one or more embodiments of the present invention.

FIG. 4 is a schematic sectional view showing a state in which components up to silicon-based thin-films and electrode layers are formed without using a mask in a process for manufacturing a solar cell in a comparative example.

FIGS. 5A and 5B are views showing a configuration of a peripheral portion of a solar cell according to one or more embodiments of the present invention, where FIG. 5A is a plan view, and FIG. 5B is a sectional view.

DETAILED DESCRIPTION OF THE EMBODIMENTS

Figure 1:
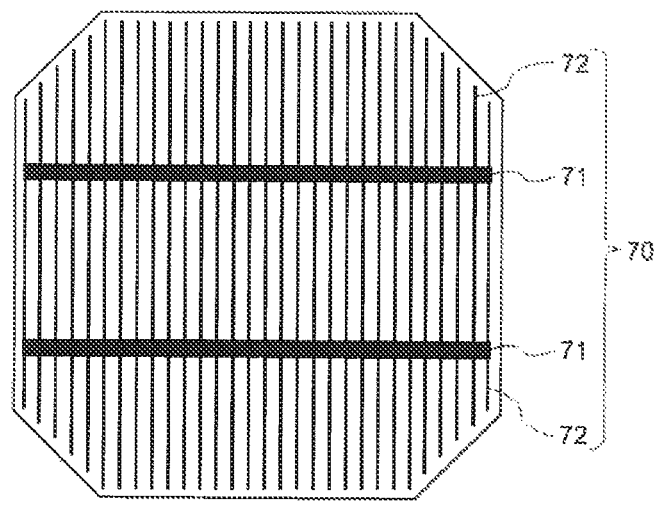
FIG. 1 is a plan view showing a collecting electrode pattern of a solar cell according to one or more embodiments of the present invention.

FIG. 1 is a plan view of a light incident surface of a solar cell, which shows one example of a pattern shape of a collecting electrode. The solar cell includes a patterned collecting electrode 70 on the light incident surface. As the pattern shape of the collecting electrode, a pattern including thin line-shaped finger electrodes 72 formed parallel to one another, and bus bar electrodes 71 that connect a plurality of finger electrodes as shown in FIG. 1 is widely used.

Figure 2:
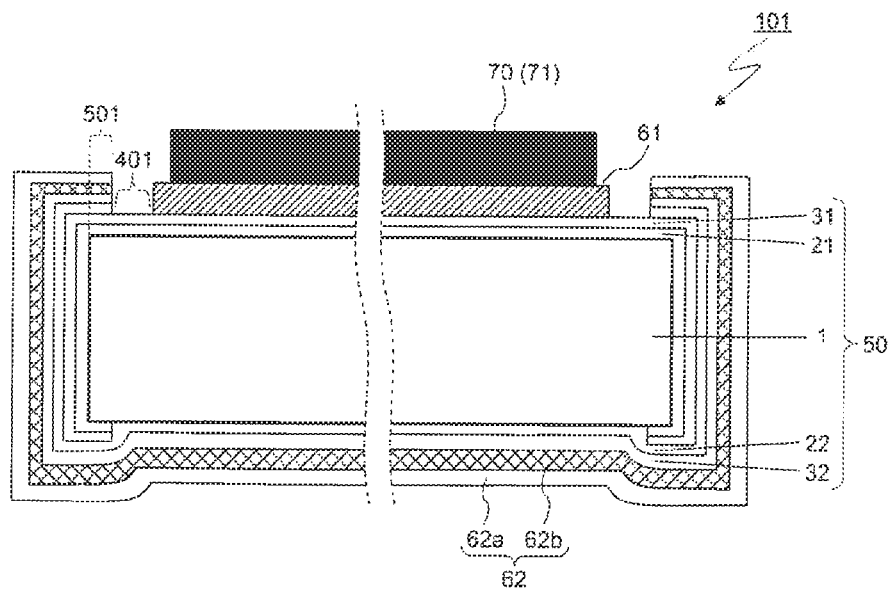
FIG. 2 is a schematic sectional view showing a solar cell according to one or more embodiments of the present invention.

FIG. 2 is a schematic sectional view of the solar cell in an extending direction of a collecting electrode 70 (bus bar electrodes 71) in FIG. 1. A solar cell 101 is a heterojunction solar cell. A photoelectric conversion section 50 of the heterojunction solar cell includes conductive silicon-based thin-films 31 and 32, which have a band gap different from that of crystalline silicon, on a surface of a crystalline silicon substrate 1. The silicon-based thin-film may be amorphous. In particular, a solar cell in which intrinsic silicon-based thin-films 21 and 22 are interposed between the conductive silicon-based thin-films 31 and 32 for forming a diffusion potential and the crystalline silicon substrate 1, respectively, is known as one of the forms of solar cells which have the highest conversion efficiency. A first electrode layer 61 and a patterned collecting electrode 70 are provided on a first principal surface of the photoelectric conversion section 50, and a second electrode layer 62 is provided on a second principal surface of the photoelectric conversion section 50.

The solar cell according to one or more embodiments of the present invention has on the peripheral portion of the first principal surface of the photoelectric conversion section 50 an insulating region 401 on which no first electrode layer 61 and second electrode layer 62 are formed. In this specification, the "peripheral end" of the principal surface refers to an end edge of the principal surface. The "peripheral portion" refers to a peripheral end and a region extending over a predetermined distance (several tens µm to several mm) from the peripheral end.

FIG. 3 is a schematic sectional view showing one embodiment of a solar cell module, where adjacent solar cells 101 are electrically connected to each other through a wiring member 9. Two solar cells disposed adjacent to each other are connected in series by connecting an electrode on the first principal surface of one solar cell to an electrode on the second principal surface of the other solar cell by the wiring member. When the collecting electrode 70 includes finger electrodes 72 and bus bar electrodes 71 as shown in FIG. 1, the wiring member is generally connected to the bus bar electrode.

Stacking Configuration of Heterojunction Solar Cell

Hereinafter, a configuration of the solar cell according to one or more embodiments of the present invention will be described with reference to FIG. 2. In the heterojunction solar cell according to one or more embodiments of the present invention, an n-type single-crystalline silicon substrate is used as the crystalline silicon substrate 1. The conductive silicon-based thin-film 31 on the first principal surface (light incident side) is a p-type silicon-based thin-film, and the conductive silicon-based thin-film 32 on the second principal surface (back side) is an n-type silicon-based thin-film. In one or more embodiments, the crystalline silicon substrate 1 has a textured structure (irregularity structure) from the viewpoint of light confinement or the like. The shape of the texture may be a pyramid shape. Pyramid-shaped textures can be formed by subjecting a surface of the single-crystalline silicon substrate to an anisotropic etching treatment.

i-type hydrogenated amorphous silicon composed of silicon and hydrogen may be used as the intrinsic silicon-based thin-films 21 and 22 deposited on the crystalline silicon substrate 1. When i-type hydrogenated amorphous silicon is deposited on a crystalline silicon substrate, surface passivation can be effectively performed while suppressing diffusion of impurities to the crystalline silicon substrate. The thickness of each of the intrinsic silicon-based thin-films 21 and 22 may be 3 to 16 nm, 4 to 14 nm, or 5 to 12 nm.

In this specification, the "thickness" refers to a thickness on the deposition surface. When textures are formed on the substrate, the vertical direction of the texture sloped surface is a thickness direction.

The conductive silicon-based thin-films 31 and 32 may be amorphous silicon-based, thin-films, microcrystalline silicon-based thin-films (thin-films containing amorphous silicon and crystalline silicon), and the like. For the silicon-based thin-film, not only silicon but also a silicon-based alloy such as silicon oxide, silicon carbide or silicon nitride can be used. Among them, the conductive silicon-based thin-film may be an amorphous silicon thin-film.

The thickness of each of the conductive silicon-based thin-films 31 and 32 may be 3 to 30 nm. For reducing a current loss resulting from absorption of light by the silicon-based thin-film, the thickness of the p-type silicon-based thin-film 31 disposed on the light incident side of the silicon substrate 1 may be as small as possible within a range which allows a diffusion potential to be formed. The thickness of the p-type silicon-based thin-film 31 may be 10 nm or less, or 8 nm or less. On the other hand, the current loss resulting from absorption of light by the n-type silicon-based thin-film 32 disposed on the back side of the silicon substrate 1 is smaller than the loss resulting from absorption of light by the p-type silicon-based thin-film 31. Accordingly, it is possible that the n-type silicon-based thin-film 32 has a thickness larger than that of the p-type silicon-based thin-film 31 from the viewpoint of formation of a diffusion potential and reduction of damage to the substrate etc. during deposition of the second electrode layer. Specifically, the thickness of the n-type silicon-based thin-film may be larger than the thickness of the p-type silicon-based thin-film by 1 nm or more, or by 2 nm or more.

In one or more embodiments of the present invention, formation of the p-type silicon-based thin-film 31 is performed prior to formation of the n-type silicon-based thin-film 32. Accordingly, at the wraparound portion of the silicon-based thin-film on the side surface of the photoelectric conversion section 50 and the peripheral portion of the principal surface, the p-type silicon-based thin-film 31 is situated closer to the n-type crystalline silicon substrate 1 than the n-type silicon-based thin-film 32. Since an nip/n junction is formed on the side surface and the peripheral portion of the principal surface when seen from the silicon substrate side, a reverse current is inhibited, so that leakage can be suppressed.

On the first principal surface of the photoelectric conversion section 50 (on the p-type silicon-based thin-film 31), a transparent electrode layer is formed as the first electrode layer 61. Conductive oxides may be used as a material for the transparent electrode layer. As the conductive oxide, for example, zinc oxide, indium oxide and tin oxide may be used alone or as a composite oxide. From the viewpoints of electroconductivity, optical characteristics and long-term reliability, indium-based oxides may be used. Among them, indium-based oxides doped with a dopant may be used. As the dopant to the indium-based oxide, tin, tungsten, cerium, titanium or hydrogen may be used. The concentration of the dopant may be 0.1 atom % or more and 15 atom % or less, or 1 atom % or more and 10 atom % or less. One mainly composed of indium tin oxide (ITO) may be used. Here, the wording "as a main component" means that the content is more than 50% by weight, 70% by weight or more, or 90% by weight or more. The transparent electrode layer may be a single layer or a layered structure composed of multiple layers.

The thickness of the first electrode layer 61 may be 10 nm or more and 200 nm or less, from the viewpoints of transparency, electroconductivity and reduction of light reflection. The role of the first electrode layer is to transport carriers to the collecting electrode 70, and it suffices that the first electrode layer has a level of electroconductivity required for this purpose.

The second electrode layer 62 is formed on the second principal surface (n-type silicon-based thin-film 32) of the photoelectric conversion section 50. As the second electrode layer 62, a transparent electrode layer or a metal electrode layer is used. The second electrode layer 62 may be a stacked layer of a transparent electrode layer 62a and a metal electrode layer 62b as shown in FIG. 2. For the metal electrode layer, it is desirable to use a material which has a high reflectivity to light having a wavelength in a near-infrared to infrared range and which has low resistance (e.g., a resistivity of $3 \times 10^{-6}$ $\Omega$cm or less) and high chemical stability. Examples of the material having the above-mentioned properties include silver, copper and aluminum. When the metal electrode layer 62b is not formed, the concentration of the dopant in the transparent electrode layer in the second electroconductive layer may be low for increasing contact resistance between the wiring member and the second electroconductive layer at the wraparound portion. When an indium-based oxide is used for the second electrode layer, the dopant concentration may be 10 atom % or less, or 3 atom % or less.

When the second electrode layer 62 includes a metal electrode layer, light which is not absorbed in the photoelectric conversion section, and arrives at the second principal surface is reflected by the metal electrode layer, and made to reenter the photoelectric conversion section, so that light utilization efficiency can be improved. Particularly, silicon has a small light absorption coefficient in a near-infrared and a longer-wavelength range, and therefore when a material having high light reflectance to light with a near-infrared to infrared wavelength range is used for the metal electrode layer, light utilization efficiency can be improved to increase the current value in the solar cell. When the transparent electrode layer 62a mainly composed of a metal oxide is provided between the photoelectric conversion section 50 and the metal electrode layer 62b, improvement of adhesion between the photoelectric conversion section and the second electrode layer and reduction of contact resistance are attained, and diffusion of a metal component from the metal electrode layer 62b to the photoelectric conversion section 50 is inhibited by the transparent electrode layer 62a, so that the conversion characteristic can be improved.

The thickness of the second electrode layer 62 can be appropriately set according to a stacking configuration of the electrode, for example a configuration in which the second electrode layer is composed of a transparent electrode layer, a configuration in which the second electrode layer includes a metal electrode layer, or a configuration in which a patterned collecting electrode is formed on the second electrode layer 62. For example, when the second electrode layer 62 is composed of a transparent electrode layer, and a patterned collecting electrode is formed on a transparent electrode layer, the thickness of the second electrode layer 62 may be 5 to 500 nm, or 10 to 200 nm. When the second electrode layer includes a metal electrode layer, the thickness of the second electrode layer 62 may be 50 nm to 30 µm, or 100 nm to 20 µm.

In this specification, the "metal electrode layer" in the second electrode layer refers to a metal electrode formed on the whole of the second principal surface. A patterned collecting electrode as shown in FIG. 1 is not included in the "metal electrode layer".

As the method for forming the silicon-based thin-film, the transparent electrode layer and the metal electrode layer; a dry process such as a CVD method, a sputtering method, a vapor deposition method or an ion plating method may be used. In particular, the silicon-based thin-film may be formed by a plasma-enhanced CVD method. The method for forming the transparent electrode layer may be a physical vapor deposition method such as a sputtering method, a chemical vapor deposition method using a reaction of an organic metal compound with oxygen or water (MOCVD), or the like. The method for forming the metal electrode layer may be a physical vapor deposition method such as a sputtering method or a vacuum vapor deposition method. The metal electrode layer can also be formed by a plating method.

Configuration of Peripheral Portion

FIG. 4 is a sectional view schematically showing a state in which silicon-based thin-films 21 and 31 and a first electrode layer 61 are formed on a first principal surface of a silicon substrate 1, and silicon-based thin-film 22 and 32 and a second electrode layer 62 are formed on a second principal surface of a silicon substrate 1, without using a mask. FIG. 4 schematically shows a structure when an intrinsic silicon-based thin-film 21 and a p-type silicon-based thin-film 31 are formed on the first principal surface of the silicon substrate 1, an intrinsic silicon-based thin-film 22 and an n-type silicon-based thin-film 32 are thereafter formed on the second principal surface, and thereafter a first electrode layer 61 and a second electrode layer 62 are formed.

When the above layers are formed by a dry process such as CND method, sputtering method and ion plating method without using a mask, the silicon-based thin-films 22 and 32 and the second electrode layer 62 on the second principal surface of the silicon substrate 1 extend to the side surface and peripheral portion of the first principal surface of the crystalline silicon substrate 1 due to wraparound during deposition. The silicon-based thin-films 21 and 31 and the first electrode layer 61, which are formed on the first principal surface of the crystalline silicon substrate 1, extend to the side surface and the peripheral portion of second principal surface of the single-crystalline silicon substrate 1 due to wraparound during deposition. When such wraparound occurs during the deposition, the characteristics of the solar cell are deteriorated as the first electrode layer 61 and the second electrode layer 62 are short circuited as is understood from FIG. 4.

On the other hand, as shown in FIGS. 2 and 5A and 5B, the solar cell according to one or more embodiments of the present invention has on the peripheral portion of the first principal surface of the photoelectric conversion section an insulating region 401 on which neither the first electrode layer nor the second electrode layer is formed. Owing to existence of the insulating region, the short-circuit between the first electrode layer and the second electrode layer may be prevented.

FIG. 5A is a plan view from the first principal surface side in the process for manufacturing the solar cell according to one or more embodiments of the present invention. In the state shown in FIG. 5A, the silicon-based thin-films 21 and 31 and the first electrode layer 61 are formed on the first principal surface of the crystalline silicon substrate 1, and the silicon-based thin-films 22 and 32 and the second electrode layer 62 are formed on the second principal surface. At the peripheral portion of the first principal surface, a wraparound portion 501 of the second electrode layer, the insulating region 401 and a first electrode layer 61 formed region exist, in this order from the peripheral end to the substrate plane center.

FIG. 5B is a sectional view taken along line B1-B2 in FIG. 5A. As shown in FIG. 5B, the second electrode layer 62 is formed on the whole surface including the peripheral end of the second principal surface of the photoelectric conversion section. The second electrode layer 62 is also formed on the side surface of the photoelectric conversion section and on the peripheral portion of the first principal surface in a wraparound manner. Specifically, the second electrode layer 62 has a portion 621 formed on the second principal surface of the photoelectric conversion section, a portion 623 formed on the side surface of the photoelectric conversion section, and a portion 625 formed on the peripheral portion of the first principal surface in a wraparound manner. The portion 625 at which the second electrode layer is formed on the peripheral portion of the first principal surface in a wraparound manner corresponds to the wraparound portion 501 in FIG. 5A.

In the peripheral portion of the first principal surface, a region having a width $W_1$ from the peripheral end is a first electrode layer-non-formed region on which the first electrode layer is not formed. The width $W_2$ of the wraparound portion 501 is smaller than the width $W_1$ of the first electrode layer-non-formed region, and therefore at the peripheral portion of the first principal surface, the insulating region 401 having a width $W_0 = W_1 \cdot W_2$ exists.

Existence of an insulating region on the first principal surface of the photoelectric conversion section as described above prevents a short-circuit between the first electrode layer 61 and the second electrode layer 62, so that the conversion efficiency of the solar cell is improved. Further, on the second principal surface of the photoelectric conversion section, the second electrode layer is formed on the whole surface including the peripheral end, and thus carriers can be effectively collected even at the peripheral portion of the photoelectric conversion section. Accordingly, in the configuration according to one or more embodiments of the present invention, improvement of conversion efficiency can be expected as compared to a case where the photoelectric conversion section has an insulating region on both surfaces thereof.

In the configuration according to one or more embodiments of the present invention, an intrinsic silicon-based thin-film is also formed on the side surface of the silicon substrate 1, and thus a passivation effect to the silicon substrate is obtained even at the side surface of the substrate. Accordingly, carrier recombination at the side surface is suppressed, it can be expected to improve open circuit voltage (Voc) and fill factor (FF) as compared to a method in which the peripheral portion of the silicon substrate is cleaved to form an insulating region. In the configuration according to one or more embodiments of the present invention, improvement of conversion efficiency can be expected because the effective power generation area is larger as compared to a case where the substrate is cleaved.

As shown in FIG. 5B, the solar cell according to one or more embodiments of the present invention has the insulating region 401 on the peripheral portion of the first principal surface, and the p-type silicon-based thin-film 31 is situated closer to the n-type crystalline silicon substrate 1 than the n-type silicon based thin-film 32. In this configuration, leakage can be reduced as compared to a configuration shown in FIG. 6 where an insulating region is provided on the peripheral portion of the second principal surface.

Figure 6:
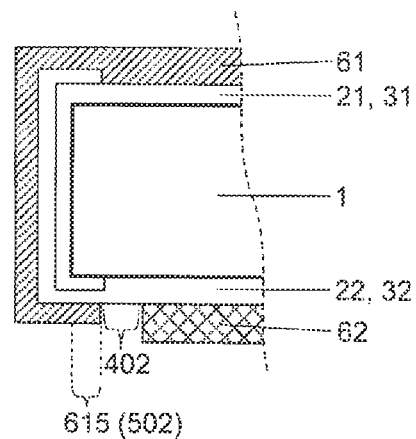
FIG. 6 is a sectional view showing a configuration of a peripheral portion of a solar cell in a comparative example.

FIG. 6 schematically shows a form in which the first electrode layer 61 is deposited to extend to the peripheral portion of the second principal surface in a wraparound manner, and thus the wraparound portion 502 is formed, so that the peripheral portion of the second principal surface has a region in which the second electrode layer 62 is not formed, and thus the insulating region 402 exists on the second principal surface. In this form, a leakage passage through an n-layer 32 exists between the second electrode layer 62 and the first electrode layer 615 formed to extend to the second principal surface in a wraparound manner. The n-type crystalline silicon substrate 1 may also form a leakage passage between the second electrode layer 62 and the first electrode layer 615 by passing through the n-layer 32 and an i-layer 22.

In the form shown in FIG. 5B, a leakage passage through a p-layer 31, and the n-layer 32 formed to extend to the first principal surface in a wraparound manner exists between the first electrode layer 61 and the wraparound portion 501 of the second electrode layer on the first principal surface. However, the player 31 formed on the light incident side of the silicon substrate has a smaller thickness and larger resistance in the planedirection as compared to the n-layer 32, and therefore in the form shown in FIG. 5B, the leakage amount through the conductive silicon-based thin-film is smaller as compared to the case shown in FIG. 6 where the n-layer forms a leakage passage.

In the form shown in FIG. 5B, the player 31 exists between the first electrode layer 61 and the n-type crystalline silicon substrate 1 and between the wraparound portion 625 of the second electrode layer and the n-type crystalline silicon substrate 1, and therefore leakage through the n-type crystalline silicon substrate does not occur. Further, on the side surface of the photoelectric conversion section, the p-layer 31 is situated closer to the n-type crystalline silicon substrate 1 than the n-layer 32, and an n/p/n junction is formed on the side surface and the peripheral portion of the principal surface when seen from the silicon substrate side, so that a reverse current is inhibited, and leakage through the side surface is suppressed.

Method for Forming Insulating Region

The method for providing an insulating region on the peripheral portion of the first principal surface may be a method in which the first electrode layer is deposited while the peripheral portion of the first principal surface is covered with a mask from the viewpoint of productivity and for reliably preventing a short-circuit on both sides due to wraparound during deposition of the electrode layer. When the peripheral portion of the first principal surface of the photoelectric conversion section is covered with a mask during deposition of the first electrode layer 61, the range of the distance $W_1$ from the peripheral end of the first principal surface corresponds to the first electrode layer-non-formed region. The width $W_1$ of the first electrode layer-non-formed portion should be larger than the width $W_2$ of the wraparound portion of the second electrode layer. The width $W_1$ may be about 50 μm to 5 mm.

When the second electrode layer is deposited without using a mask, the second electrode layer is formed on the side surface and the peripheral portion of the first principal surface in a wraparound manner. In a phase-up (deposit-down) method in which deposition is performed with a substrate disposed in such a manner that the deposition surface faces upward, the second electrode layer is formed on the whole surface including the peripheral end of the second principal surface. In a phase-down (deposit-up) method in which deposition is performed with a substrate disposed in such a manner that the deposition surface faces downward, the second electrode layer is formed on the whole of the second principal surface excluding a holding portion for mounting the substrate.

An electrode layer may be deposited on the whole of the second principal surface, the side surface and the peripheral portion of the first principal surface in a wraparound manner by a dry process, followed by forming another electrode layer by a plating method. When a metal layer is formed by an electroplating method, the plating thickness on the second principal surface is apt to be equivalent to the plating thickness on the wraparound portion of the peripheral portion of the first principal surface. For suppressing leakage through the wiring member in a solar cell module, a plating technique for reducing the plating thickness on the wraparound portion may be selected. For example, in an electroplating, arranging a shielding plate between a plating electrode and a plating object can reduce an electric field density in a specific region, thereby the plating thickness in the low electric field density region can be made smaller as compared to other portions.

For protecting the silicon based thin-film at the peripheral end of the first principal surface and in the vicinity thereof by covering this silicon-based thin-film with the wraparound portion 501 of the second electrode layer, the width $W_2$ of the wraparound portion 501 may be 5 μm or more, or 10 μm or more. For improving carrier collection efficiency by the first electrode layer 61, the width $W_1$ of the first electrode layer-non-formed portion may be small, and for preventing a short-circuit between the wraparound portion of the second electrode layer and the first electrode layer on the first principal surface, the width $W_2$ of the wraparound portion 501 may be small as long as the peripheral end of the first principal surface can be reliably protected. The width $W_2$ may be 3 mm or less, 2 mm or less, or 1 mm or less. The width $W_1$, the width $W_2$, and the $W_0$ of the insulating region are determined by optical microscope observation of the surface of the solar cell.

In one or more embodiments of the present invention, a decrease in effective power generation area, which is associated with removal of a short-circuit between electrode layers on both sides, can be maximally suppressed as compared to a method in which the peripheral end portion of the substrate is cleaved and removed, and a method in which a separation groove is formed at the peripheral portion. When a cut surface and a separation groove are formed by laser processing after formation of the electrode layer, leakage may cause due to an electrode material deposited on a laser-processed surface, damage to a p-n junction in the vicinity of a laser-processed region, or the like. In contrast, a method in which a short-circuit is prevented by depositing the electrode layer with using a mask can prevent a new leakage passage accompanied by laser processing from being formed. Further, in one or more embodiments of the present invention, since a mask is not used in deposition of the second electrode layer, the number of alignments of the mask can be reduced by half as compared to a case where a mask is used for deposition of electrode layers on both sides, leading to improvement of production efficiency.

The thickness of a portion deposited on a back surface opposite to the deposition surface in a wraparound manner during dry process deposition is smaller than the thickness on the deposition surface. Accordingly, the thickness of the wraparound portion 625 of the second electrode layer is smaller than the thickness of the second electrode layer 621 on the second principal surface. The thickness of the wraparound portion of the second electrode layer may be 1 to 200 nm. The thickness of the wraparound portion of the second electrode layer may be smaller than the thickness of the first electrode layer.

When the thickness of the wraparound portion of the second electrode layer is 1 nm or more, mechanical damage to the photoelectric conversion section in the vicinity of the peripheral end of the first principal surface can be suppressed. When the thickness of the wraparound portion of the second electrode layer is small, a leakage current through the wiring member can be suppressed (as described in detail later). The thickness of the wraparound portion of the second electrode layer may be 100 nm or less, or 50 nm or less.

Figure 7:
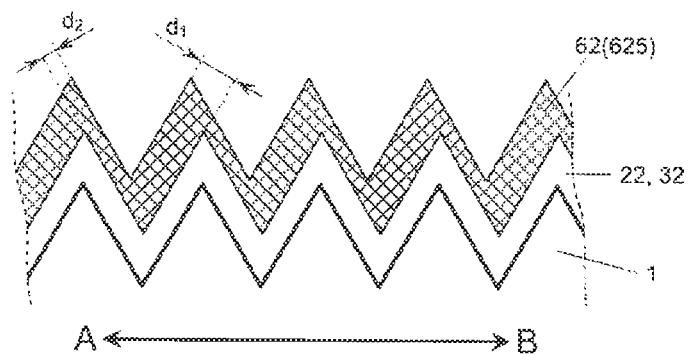
FIG. 7 is a schematic sectional view for explaining a thickness of an electrode formed on textures according to one or more embodiments of the present invention.

The thickness of the wraparound portion of the second electrode layer is determined by microscope observation of a cross-section in the vicinity of the center (position at a distance of $W_2/2$ from the peripheral end) in the width direction of the wraparound portion. When a wraparound portion is formed on a textured structure, the thickness $d_1$ on the sloped surface on the peripheral end side (A side in FIG. 7) tends to be larger than the thickness $d_2$ on the sloped surface on the center side (B side in FIG. 7) of the substrate plane as shown in FIG. 7. Here, the average of the thickness $d_1$ and the thickness $d_2$ is defined as a thickness of the wraparound portion of the second electrode layer.

As shown in FIG. 7, when the thickness of the wraparound portion of the second electrode layer on the sloped surface on the peripheral end side is small, or a region with a small thickness exists in the wraparound portion on a local basis, the portion with a small thickness has high resistance, and forms a bottleneck in a leakage passage, so that a leakage current through the wiring member tends to decrease. The wraparound portion of the second electrode layer may include a region where the second electrode layer is formed in an island shape.

Collecting Electrode

The collecting electrode 70 is formed on the first electrode layer 61. The collecting electrode 70 can be prepared by a known technique such as an inkjet method, a screen printing method, a wire bonding method, a spraying method, a vacuum vapor deposition method, a sputtering method or a plating method. For formation of a patterned collecting electrode, a screen printing method is suitable from the viewpoint of productivity. In the screen printing method, a pattern is printed using a printing paste containing metal particles, and a screen plate having an opening pattern corresponding to the pattern shape of a collecting electrode. When a material containing a solvent is used as the printing paste, it is possible that drying is performed for, for example, about 5 minutes to 1 hour for removing the solvent. For sufficiently improving the electroconductivity of a collecting electrode formed by the screen printing method, it is desirable to cure a binder resin in the paste by heat treatment. The binder resin contained in the paste may be an epoxy-based resin, a phenol-based resin, an acrylic resin or the like.

The collecting electrode may include a plurality of layers. For example, the collecting electrode may have a stacking configuration including a lower layer having low contact resistance with the first electrode layer 61 and an upper layer having an excellent connection characteristic with the wiring member 9. According to this structure, improvement of the fill factor of the solar cell, which is associated with a reduction in contact resistance with the first electrode layer, can be expected. When the collecting electrode has a stacking configuration, further reduction of resistance of the collecting electrode and improvement of reliability can be expected.

Solar Cell Module

The solar cell according to one or more embodiments of the present invention is modularized when put into practical use. A plurality of solar cells connected in series or in parallel through a wiring member such as a TAB are sandwiched between a front surface member and a back surface member with a gap filled with an encapsulant, and are encapsulated to modularize the solar cells.

A front surface member 10 (light-transmissive member) and a back surface member 11 are plate-shaped or sheet-shaped members, and disposed on the first principal surface (light incident surface) and the second principal surface, respectively, of the solar cell 101. As a material of the front surface member 10, a transparent material such as glass or light-transmissive plastic can be employed. As the back surface member 11, a resin film such as a polyethylene terephthalate film, a steel plate, a glass plate or the like can be employed.

A encapsulant 12 fills a gap between the front surface member 10 and the back surface member 11 to encapsulate solar cells. The encapsulant is a light-transmissive and insulating adhesive resin material. As the insulating adhesive resin material, for example, a polyolefin-based resin such as polyethylene, polypropylene or an ethylene-propylene copolymer, a thermosetting resin such as polyvinyl butyral, ethylene vinyl acetate (EVA) or the like can be employed.

The wiring member 9 is a plate-shaped n electroconductive member for connecting solar cells or connecting an external circuit to a solar cell, and has bending property. As a material of the wiring member, copper is generally used. The surface of a core material such as copper may be covered with a covering material. As the covering material for the wiring member, solder is widely used for facilitating bonding the wiring member to the electrode in the solar cell. As the covering member, a metal such as silver, tin or nickel may be used. When silver is used as the covering material, the reflectivity of the wiring member can be increased. When nickel is used as the covering material, the reflectivity of the wiring member can be reduced to improve the design property of the solar cell module. A plate-shaped member having, on an upper surface (light incident surface) 9a, irregularity structure having a height of about 5 μm to 100 μm may be used as the wiring member. When the wiring member has an irregularity structure on the upper surface, reflected light at the surface of the wiring member is diffused, so that the reflected light can be made to efficiently reenter the solar cell, and therefore module performance can be improved.

Figure 8:
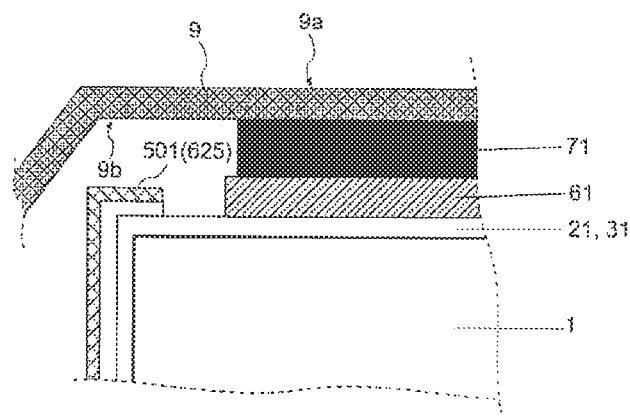
FIG. 8 is a schematic sectional view of a peripheral portion of a solar cell according to one or more embodiments of the present invention, to which a wiring member is connected.

FIG. 8 is a schematic view of a cross-section structure in the vicinity of the peripheral portion of the solar cell after connection of the bus bar electrode 71 to a lower surface 9b of the wiring member 9 and before encapsulation. The wiring member 9 connected to the bus bar electrode 71 is disposed in such a manner that the lower surface 9b faces the first principal surface of the solar cell. Before encapsulation, the wiring member 9 and the second electrode layer 625 at the wraparound portion are separated from each other.

Figure 9:
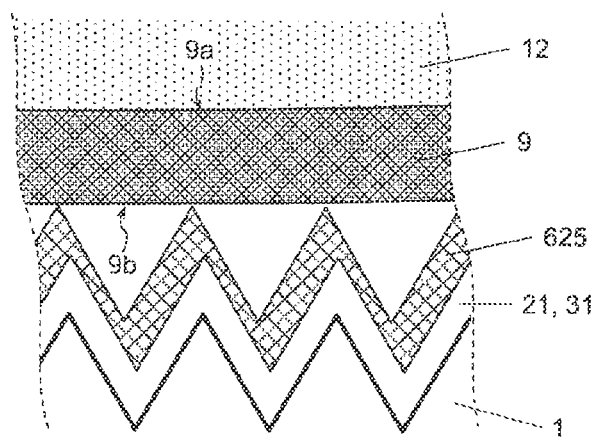
FIG. 9 is a schematic sectional view of an area in the vicinity of a peripheral end of a solar cell after encapsulation according to one or more embodiments of the present invention.

FIG. 9 is a schematic sectional view of an area in the vicinity of the peripheral end of the first principal surface after encapsulation. The lower surface 9b of the wiring member 9 and the wraparound portion 625 of the second electrode layer are partially in contact with each other under the pressure of encapsulation. When the silicon-based thin-film and the silicon substrate of the photoelectric conversion section are exposed in the vicinity of the peripheral end of the substrate, mechanical damage easily occurs due to contact with the wiring member. In a heterojunction solar cell, occurrence of mechanical damage to the silicon-based thin-film may impair the passivation function for the silicon substrate surface, leading to considerable deterioration of the conversion characteristics. On the other hand, in one or more embodiments of the present invention, the surface of the photoelectric conversion section is protected by the wraparound portion 625 of the second electrode layer as shown in FIG. 9, and therefore mechanical damage to the silicon-based thin-film due to contact with the wiring member can be prevented.

The collecting electrode on the first principal surface of the solar cell is bonded to the lower surface 9b of the wiring member, while the electrode on the second principal surface of the solar cell is bonded to the upper surface 9a of the wiring member. When a wiring member having an irregularity structure on the upper surface 9a is used, the second principal surface of the solar cell susceptible to mechanical damage due to contact with projection portions in the irregularity structure of the wiring member. When an insulating region exists on the second principal surface, mechanical damage to the silicon-based thin-film easily occurs due to contact of the insulating region with projection portions in the irregularity structure of the wiring member, leading to deterioration of the module conversion characteristics, in the solar cell according to one or more embodiments of the present invention, the second electrode layer is formed on the whole of the second principal surface, and therefore even when a wiring member having an irregularity structure on the upper surface 9a is used, mechanical damage to the silicon-based thin-film on the second principal surface hardly occurs. Accordingly, light reflected and scattered at the surface of the wiring member can be efficiently reused, and mechanical damage resulting from connection of the wiring member is small, so that a solar cell module having high conversion characteristics is obtained.

When the wiring member 9 and the wraparound portion 625 of the second electrode layer come into contact with each other, the collecting electrode 70 of the first principal surface and the second electrode layer 62 of the second principal surface in the same cell may be short-circuited, resulting in leakage. When the first principal surface of the silicon substrate 1 has a textured structure, the contact region between the second electrode layer 625 and the wiring member 9 on the first principal surface exists only in the vicinity of the top of projection portions in textures as schematically shown in FIG. 9. Accordingly, the contact area between the wraparound portion 625 of the second electrode layer and the wiring member 9 is small, and contact resistance therebetween is large, so that a leakage current resulting from contact with the wiring member can be suppressed.

The thickness of the wraparound portion 625 of the second electrode layer is smaller than the thickness of the second electrode layer 621 on the second principal surface, and therefore the wraparound portion 625 has large resistance in the plane direction. Accordingly, a leakage current resulting from contact between the wraparound portion 625 of the second electrode layer and the wiring member 9 can be suppressed.

The metal electrode layer has a resistivity smaller than that of the transparent electrode layer, and therefore when the second electrode layer 62 includes a metal electrode layer, contact resistance between the wraparound portion 625 of the second electrode layer and the wiring member 9 tends to be small, leading to an increase in leakage current as compared to a case where the second electrode layer is composed of a transparent electrode layer. When a metal layer composed of a metallic material having a resistance higher than that of a low-resistance metallic material such as Ag or Cu is provided as an outermost surface layer of the second electrode layer 62, and a high-resistance metal layer is formed so as to extend to the first principal surface in a wraparound manner, contact resistance between the wraparound portion and the wiring member can be increased to reduce a leakage current. When the metal electrode layer has a configuration in which a low-resistance metal layer and a high-resistance metal layer are stacked in this order from the photoelectric conversion section side, a leakage current resulting from contact between the wraparound portion of the second electrode layer and the wiring member can be reduced while an ohmic loss in the second electrode layer is suppressed.

The low-resistance metallic material has a low resistivity of $3\times10^{-6}$ Ωcm or less. The resistivity of the low-resistance metallic material may be $2\times10^{-6}$ Ωcm or less. The high-resistance metallic material has a resistivity of $6\times10^{-6}$ Ωcm or more. The resistivity of the high-resistance metallic material may be $10\times10^{-6}$ Ωcm or more. For keeping favorable electrical contact between the second electrode layer and the wiring member on the second principal surface, the resistivity of the high-resistance electroconductive material may be $60\times10^{-6}$ Ωcm or less. As the high-resistance electroconductive material, Ti, Sn, Cr, Ni, and alloys containing these metals can be used. When a high-resistance electroconductive material which forms a stable oxide layer on a surface, such as Ti, Al, Cr or Ni, is used, contact resistance between the wiring member and the wraparound portion of the second electrode layer can be further increased.

EXAMPLES

One or more embodiments of the present invention will be more specifically described below by showing examples relating to the heterojunction solar cell, but one or more embodiments of the present invention is not limited to the Examples below.

Example 1

Formation of Photoelectric Conversion Section

An n-type single-crystalline silicon wafer (156 mm square) having a light incident surface direction identical to the (100) surface and having a thickness of 200 μm was immersed in a 2 wt % aqueous solution for 3 minutes to remove silicon oxide covering on the surface, and thereafter rinsed twice with ultrapure water. The wafer was immersed in a 5/15 wt % aqueous KOH/isopropyl alcohol solution held at 70° C. for 15 minutes, and the surface of the wafer was etched to form pyramid-shaped textures. Thereafter, the wafer was rinsed twice with ultrapure water.

The textured wafer was introduced into a CVD apparatus, and at the light incident surface thereof (first principal surface), i-type amorphous silicon was deposited to have a thickness of 5 nm as an intrinsic silicon-based thin-film. Deposition conditions of the i-type amorphous silicon included a substrate temperature: 170° C., a pressure: 120 Pa, an $SiH_4/H_2$ flow ratio: 3/10, and a power density supply: 0.011 W/cm². The thickness of the thin-film in each of examples is a value obtained by multiplying a predetermined coefficient "s" by a thickness calculated from a product of a deposition time and a deposition rate. The deposition rate was determined by measuring the thickness of a thin-film, which is deposited on a glass substrate under the same conditions as those for the thin-film in the example, using a spectroscopic ellipsometer (trade name: M2000, manufactured by J. A. Woollam Co., Inc.), Since a substrate provided with textures has a surface area larger than that before formation of textures, the deposition rate on a textured substrate is smaller than the deposition rate on a glass substrate. In the example, the coefficient "s" was set to 0.67 on the basis of experimental data.

On the i-type amorphous silicon layer, p-type amorphous silicon was deposited to have a thickness of 7 nm. Deposition conditions of the p-type amorphous silicon layer included a substrate temperature: 150° C., a pressure: 60 Pa, an $SiH_4/B_2H_6$ flow ratio: 1/3 and a power density supply: 0.01 W/cm². The $B_2H_6$ gas flow rate mentioned above is a flow rate of a diluting gas wherein $B_2H_6$ concentration was diluted to 5000 ppm using $H_2$ gas.

Thereafter, on the back side (second principal surface) of the wafer, an i-type amorphous silicon layer was deposited to have a thickness of 6 nm as an intrinsic silicon-based thin-film. Deposition conditions of the i-type amorphous silicon layer on the second principal surface were the same as those for the aforementioned i-type amorphous silicon layer on the first principal surface. On the i-type amorphous silicon layer on the second principal surface, an n-type amorphous silicon layer was deposited to have a thickness of 20 nm. Deposition conditions of the n-type amorphous silicon layer included a substrate temperature: 150° C., a pressure: 60 Pa, an $SiH_4/PH_3$ flow ratio: 1/2 and a power density supply: 0.01 W/cm². The $PH_3$ gas flow rate mentioned above is a flow rate of a diluting gas wherein $PH_3$ concentration was diluted to 5000 ppm using $H_2$ gas.

Formation of Electrode Layers

On the p-type amorphous silicon layer on the first principal surface, indium tin oxide (ITO having a thickness of 100 nm was deposited as a first electrode layer (transparent electrode layer) by a sputtering method. In deposition of the first electrode layer, a region extending over a distance of 0.5 mm from the peripheral end of the wafer was shielded with a mask to ensure that the transparent electrode layer was not deposited at the peripheral portion of the first principal surface and on the side surface. The transparent electrode layer was deposited by applying a power density of 0.5 W/cm² in an argon atmosphere at a substrate temperature of room temperature and a pressure of 0.2 Pa using a compound sintered compact of indium oxide and tin oxide as a target.

Figure 10:
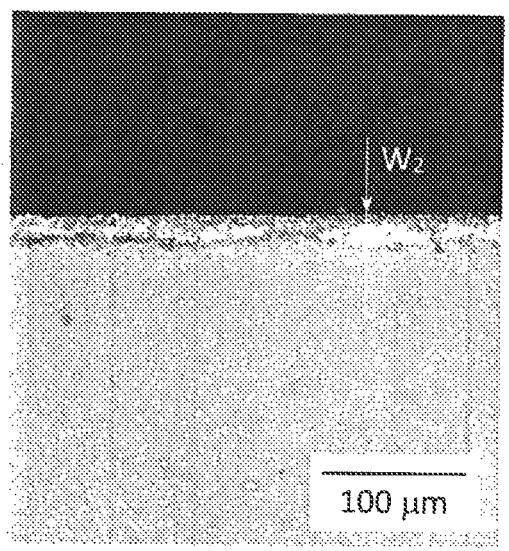
FIG. 10 is an optical microscope image of an area in the vicinity of a peripheral end of a solar cell according to one or more embodiments of the present invention.

As a second electrode layer, ITO having a thickness of 100 nm and was deposited on the n-type amorphous silicon layer on the second principal surface by a sputtering method. Sputtering conditions for deposition of the second electrode were identical to those for the first transparent electrode layer. A mask was not used in deposition of the second electrode layer, and thus the electrode layer was formed on the whole of the second principal surface and the side surface and the first principal surface peripheral portion of the substrate. FIG. 10 shows an optical microscope photograph of the first principal surface of a wafer after formation of the second electrode layer. The width of the wraparound portion of the second electrode layer to the peripheral portion of the first principal surface as determined from FIG. 10 was about 20 μm.

As described above, the transparent electrode layer was deposited on the first principal surface while the peripheral portion was covered with a mask, and the second electrode layer was deposited without using a mask, so that an insulating region with a width of about 0.4 mm was provided on the peripheral portion of the first principal surface.

Formation of Collecting Electrode

For formation of a collecting electrode, a printing paste containing a silver powder as a metallic material, and an epoxy-based resin as a binder resin was used. The paste was applied onto the first electrode layer by a screen printing method using a screen plate having an opening corresponding to a collecting electrode pattern shown in FIG. 1, and heat-treated at 200° C. Thereafter, a collecting electrode was formed on the second electrode layer by a screen printing method in the same manner as in formation of the collecting electrode on the first electrode layer.

Modularization

A plurality of solar cells were connected in series such that a collecting electrode on the first principal surface of one of adjacent solar cells and a collecting electrode on the second principal surface of the other solar cell were connected to a wiring member, and the wiring member was connected as a leading wire to each of solar cells at both ends. The collecting electrode and the wiring member were connected by solder. The solar cells after connection of the wiring member thereto were sandwiched between a glass substrate (front surface member) and a back surface sheet (back surface member) with a gap filled with an encapsulant (filler), and were encapsulated. The leading wire was attached to a wiring box to prepare a solar cell module. In the solar cell module after encapsulation, the wiring member was in contact with the wraparound portion of the second electrode layer on the first principal surface.

Example 2

As the second electrode layer, Ag was deposited to have a thickness of 500 nm by a sputtering method subsequently to deposition of ITO (transparent electrode) having a thickness of 100 nm. As in the case of ITO, Ag for the second electrode layer was deposited to extend to the side surface of the substrate and the peripheral portion of the first principal surface in a wraparound manner. In Example 2, the collecting electrode was not formed on the second electrode layer, and the collecting electrode on the first principal surface and the second electrode layer were connected to the wiring member, so that a plurality of solar cells were connected in series. A solar cell module was prepared in the same manner as in Example 1 except for these points.

Example 3

As the second electrode layer, Ag having a thickness of 500 nm and Ti having a thickness of 20 nm were deposited in this order by a sputtering method subsequently to deposition of ITO (transparent electrode) having a thickness of 100 nm. In Example 3, an electroconductive film (CF) was used for connection of the wiring member and the second electrode layer. A solar cell module was prepared in the same manner as in Example 2 except for these points.

Example 4

A solar cell module was prepared in the same manner as in Example 3 except that Ag having a thickness of 500 nm and Cr having a thickness of 20 nm were deposited in this order by a sputtering method subsequently to deposition of ITO (transparent electrode) having a thickness of 100 nm as the second electrode layer.

Example 5

A solar cell module was prepared in the same manner as in Example 3 except that Ag having a thickness of 50 nm, Cu having a thickness of 500 nm and Cr having a thickness of 20 nm were deposited in this order by a sputtering method subsequently to deposition of ITO (transparent electrode) having a thickness of 100 am as the second electrode layer.

Comparative Example 1

A mask was not used during formation of an electrode layer, both the first electrode layer and the second electrode layer were formed to extend to the opposite principal surface in a wraparound manner as shown in FIG. 4. Thereafter, laser light was applied from the light incident side to form a separation groove (insulating region) at a position 0.5 mm away from the peripheral end of the substrate. The separation groove extended to the crystalline silicon substrate. A solar cell module was prepared in the same manner as in Example 1 except for these points.

Comparative Example 2

A mask was not used during deposition of the first electrode layer, and the second electrode layer was deposited while a region of 0.5 mm from the peripheral end was covered with a mask, so that an insulating region was provided on the peripheral portion of the second principal surface. A solar cell module was prepared in the same manner as in Example 1 except for these points.

Comparative Example 3

A solar cell module was prepared in the same manner as in Example 1 except that both the first electrode layer and the second electrode layer were deposited while a region of 0.5 mm from the peripheral end of the substrate was covered with a mask, so that an insulating region was provided on both the first principal surface and the second principal surface.

Evaluation

Thickness of Wraparound Portion of Second Electrode Layer

The thickness of the electrode at a position about 10 μm from the peripheral end of the substrate was determined by transmission electron microscope observation of a cross-section.

Leakage Current

A leakage current was determined from a dark current in application of a voltage of −2 V to each of a solar cell before modularization and a solar cell module. In the solar cell module, a value obtained by dividing a dark current by the number of series connections (leakage current per cell) was defined as a leakage current.

Module Performance

Using a solar simulator having an AM 1.5 spectrum distribution, simulated solar light was applied at an energy density of 100 mW/cm$^2$ under an environment at 25° C. to measure solar cell characteristics.

Manufacturing conditions, and results of evaluation of module performance and leakage currents in examples and comparative examples are shown in Table 1. In Table 1, module performance is shown as relative values where the fill factor (FF), the current (Isc) and the maximum power (Pmax) of the module in Comparative Example 1 are each set to 1.

TABLE 1

| | | wraparound portion | | insulating region | | module performance | | | leakage current | |
|---|---|---|---|---|---|---|---|---|---|---|
| | Second electrode structure | thickness | outermost surface layer | position | process | FF | Isc | Pmax | cell | module |
| Example 1 | ITO(100) | 10 | ITO | front | mask | 1.02 | 1.01 | 1.034 | <1 mA | 2 mA |
| Example 2 | ITO(100)/Ag(500) | 30 | Ag | front | mask | 1.00 | 1.01 | 1.013 | <1 mA | 9 mA |
| Example 3 | ITO(100)/Ag(500)/Ti(20) | 30 | Ti | front | mask | 1.01 | 1.01 | 1.019 | <1 mA | 1 mA |
| Example 4 | ITO(100)/Ag(500)/Cr(20) | 30 | Cr | front | mask | 1.01 | 1.01 | 1.024 | <1 mA | 3 mA |

TABLE 1-continued

|  | Second electrode structure | wraparound portion thickness | wraparound portion outermost surface layer | insulating region position | module process | FF | Isc | Pmax | leakage current cell | leakage current module |
|---|---|---|---|---|---|---|---|---|---|---|
| Example 5 | ITO(100)/Ag(50)/Cu(500)/Cr(20) | 30 | Cr | front | mask | 1.01 | 1.01 | 1.024 | <1 mA | 3 mA |
| Comparative Example 1 | ITO(100 nm) | 100 | ITO | front | laser | 1 | 1 | 1 | 80 mA | 80 mA |
| Comparative Example 2 | ITO(100 nm) | 10 | ITO | back | mask | 1.00 | 1.01 | 1.012 | 20 mA | 20 mA |
| Comparative Example 3 | ITO(100 nm) | — | — | front & back | mask | 1.01 | 1.00 | 1.011 | <1 mA | 2 mA |

In Example 1 where the first electrode layer was deposited with using a mask to provide an insulating region on the first principal surface (front surface), a higher current (Isc) and fill factor (FF) were obtained as compared to Comparative Example 1 where a separation groove was provided by laser processing. This difference is ascribable to the fact that in Comparative Example 1, laser irradiation during preparation caused damage to the amorphous silicon layer and the crystalline silicon substrate, leading to formation of a leakage passage, and carriers generated on the peripheral end from the separation groove were not collected.

Comparison between Example 1 and Comparative Example 2 shows that the leakage current is smaller, and thus a higher fill factor (FF) is obtained when the insulating region exists on the first principal surface than when the insulating region exists on the second principal surface. It is apparent that in Example 1, the leakage current amount is small even after modularization is performed through a wiring member, and thus leakage through the wiring member is suppressed. In Comparative Example 2, leakage current amounts before and after modularization were comparable to each other. This is because the leakage amount in a single cell was large, and therefore a leakage current through the wiring member was not detected. It is considered that leakage through the wiring member, which is comparable to that in Example 1, occurs in Comparative Example 2.

Comparison between Example 1 and Comparative Example 3 shows that when an insulating region is provided on the first principal surface, a higher current (Isc) obtained. This difference is ascribable to, for example, the fact that in Example 1, the effective power generation area is large because the second electrode layer is formed to extend to the first principal surface in a wraparound manner, or damage associated with connection to the wiring member in modularization hardly occurs because the peripheral end of the photoelectric conversion section is covered with the electrode layer.

In Examples 2 to 5 where the transparent electrode layer and the metal electrode layer as the second electrode layer were stacked, a higher fill factor (FE) was obtained because leakage in a single cell was smaller, and a leakage current after modularization was smaller as compared to Comparative Examples 1 and 2. It can be understood that in a case where a high-resistance metal layer composed of Cr (volume resistivity=$1.3 \times 10^{-7}$ Ωcm), Ti (volume resistivity=$4.3 \times 10^{-7}$ Ωcm), or the like having a volume resistivity higher than that of Ag is formed as the outermost surface layer of the second electrode layer, the leakage current after modularization is smaller and thus the fill factor (FF) is improved as compared to Example 2 where the outermost surface layer is composed of Ag, since the high-resistance metal layer forms the outermost surface layer of the wraparound portion of the first principal surface. In Examples 2 to 5, the thickness of the second electrode layer was 600 to 670 nm, and the thickness of the second electrode layer formed on the first principal surface in a wraparound manner did not vary and was approximately equivalent among these examples.

DESCRIPTION OF REFERENCE CHARACTERS

1 n-type crystalline, silicon substrate
21, 22 intrinsic silicon-based thin-film
31 p-type silicon-based thin-film
32 n-type silicon-based thin-film
61 first electrode layer
62 second electrode layer
70 collecting electrode
501 wraparound portion
401 insulating region
101 solar cell
9 wiring member Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A method for manufacturing a solar cell, the method comprising:
    forming a p-type silicon-based thin-film on a first principal surface of an n-type crystalline silicon substrate;
    forming an n-type silicon-based thin-film on a second principal surface of the crystalline silicon substrate after the forming the p-type silicon-based thin-film;
    depositing a transparent first electrode layer on a first principal surface of a photoelectric conversion section by a dry process while a peripheral end of the first principal surface of the photoelectric conversion section is covered with a mask such that the first electrode layer is not deposited on the peripheral end of the first principal surface and a side surface of the photoelectric conversion section; and
    depositing a second electrode layer on a second principal surface of the photoelectric conversion section by a dry process without using a mask, wherein
    the photoelectric conversion section comprises the crystalline silicon substrate, the p-type silicon-based thin-film, and the n-type silicon-based thin-film,
    the second electrode layer extends from the second principal surface of the photoelectric conversion section through the side surface to the peripheral portion of the first principal surface in a wraparound manner, the first principal surface of the photoelectric conversion section comprises an insulating region between the first electrode layer and a wraparound portion of the second electrode layer, wherein neither the first electrode layer nor the second electrode layer is provided on the insulating region, and the first electrode is not formed on the wraparound portion of the second electrode layer.

2. The method according to claim 1, the method further comprising forming a patterned collecting electrode on the first electrode layer, wherein the solar cell comprises:

the photoelectric conversion section;

the first electrode layer provided on the p-type silicon-based thin-film;

the second electrode layer provided on the n-type silicon-based thin-film; and the patterned collecting electrode provided on the first electrode layer.

3. The method according to claim 1, wherein the forming the p-type silicon-based thin-film and the forming the n-type silicon-based thin-film are each performed by a dry process without using a mask.

4. The method according to claim 1, wherein the first principal surface of the photoelectric conversion section has an irregularity structure with sloped surfaces.

5. A method for manufacturing a solar cell module, the method comprising:

manufacturing the solar cell by the method according to claim 1;

connecting a wiring member to a patterned collecting electrode of the solar cell, wherein the wiring member is provided for electrically connecting the solar cell to an external circuit or to another solar cell; and encapsulating the solar cell after the wiring member connected.

6. The method for manufacturing the solar cell module according to claim 5, wherein the wiring member has an irregularity structure on a surface on a light incident side.

* * * * *